United States Patent

[11] 3,623,127

[72] Inventor Ashley C. Glenn
2440 Dorian Drive, Reading, Ohio 45215

[21] Appl. No. 873,211
[22] Filed Nov. 3, 1969
[45] Patented Nov. 23, 1971

[54] ELECTRICAL PRINTED CIRCUIT SWITCHING DEVICE
4 Claims, 14 Drawing Figs.

[52] U.S. Cl. .......... 200/16 R, 317/101 DH, 317/101 CE, 339/18 R
[51] Int. Cl. .......... H01h 15/00, H05k 5/00, H02b 1/04
[50] Field of Search .......... 340/166; 317/101, 112; 200/16, 166 PC, 11 TW; 339/196, 17 R, 17 M, 18 R; 317/101 DH

[56] References Cited
UNITED STATES PATENTS

| | | | |
|---|---|---|---|
| 3,200,297 | 8/1965 | Gibson | 317/101 DH |
| 3,215,898 | 11/1965 | Perret et al. | 317/101 C X |
| 3,368,115 | 2/1968 | Hoffman | 317/101 DH |
| 3,396,358 | 8/1968 | Ballard et al. | 339/18 R |

*Primary Examiner*—J. R. Scott
*Attorney*—Pearce & Schaeperklaus

ABSTRACT: A switching device which comprises a boxlike enclosure in which contact boards are mounted for relative movement. Interconnecting contacts on the contact boards establish paths of electrical connection between input conductors and rows of outwardly extending contacts. The contact boards are moved between selected positions to connect selected rows of outwardly extending contacts to the input conductors. Circuit boards each having contacts engageable with outwardly extending contacts of a selected row are mounted in the enclosure in position for engagement of contacts of the circuit board with the outwardly extending contacts of one row. Movement of the contact boards permits connection of selected pairs of input conductors when the contacts boards are in selected positions.

INVENTOR.
ASHLEY C. GLENN
BY
ATTORNEYS

INVENTOR.
ASHLEY C. GLENN

By

ATTORNEYS

INVENTOR.
ASHLEY C. GLENN

By

Pearce & Schaeperklaus

ATTORNEYS

INVENTOR
ASHLEY C. GLENN
BY
ATTORNEYS

INVENTOR.
ASHLEY C. GLENN

By
Pearne and Schaefer... [signature]

ATTORNEYS

ELECTRICAL PRINTED CIRCUIT SWITCHING DEVICE

This invention relates to switching devices. More particularly, this invention relates to a switching device for an electric or an electronic organ or the like.

An object of this invention is to provide a switching device which permits a large number of different interconnections between sets of connectors.

A further object of this invention is to provide such a switching device in which only a short movement of a slide or slides is required between switch positions.

A further object of this invention is to provide a switching device in which a program of switch arrangements can be set up so that the slides are advanced in a regular progression or in which any one of the switch arrangements can be selected as desired.

Briefly, this invention provides a switching device which includes a stationary contact board, a pair of movable contact boards, and a plurality of interchangeable circuit boards. The contact boards serve to connect a series of leads to contacts of a selected circuit board, and connections on the selected circuit board interconnect selected leads. Incoming leads and outgoing leads are connected to stationary board. Interconnecting contacts on the moving contact boards and on the stationary contact board provide varying paths to the contacts on the interchangeable circuit boards as the movable contact boards are moved.

The above and other features and objects of the invention will be apparent to those skilled in the art to which this invention pertains from the following detailed description and the drawings, in which.

In the following detailed description and the drawings, like reference characters indicate like parts.

Figure 2:
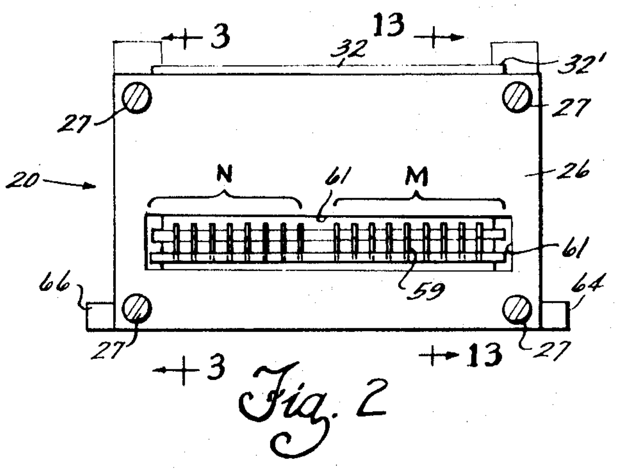
FIG. 2 is a view in end elevation of the device shown in FIG. 1 looking in the direction of the arrows 2—2 in FIG. 1 with a cover in place thereon.
Figure 3:
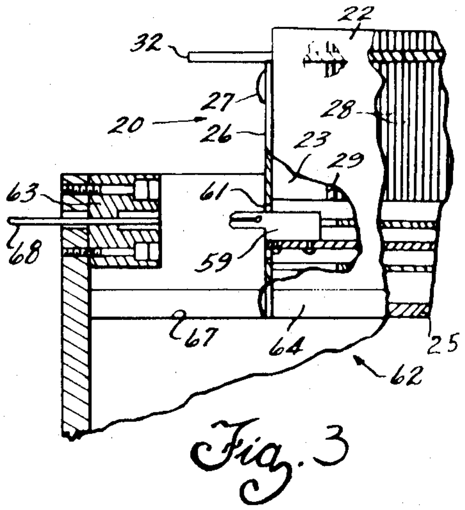
FIG. 3 is a view in section taken on the line 3—3 in FIG. 2, a fragmentary portion of an outer receptacle being shown in association with device.
Figure 1:
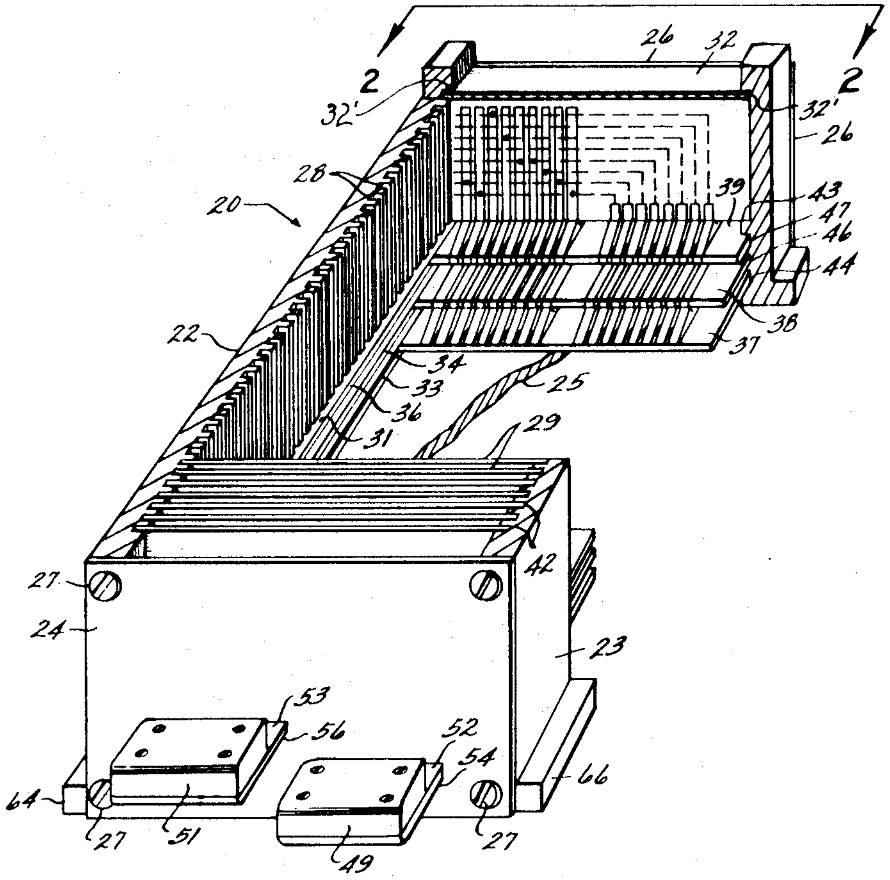
FIG. 1 is a perspective view of a switching device constructed in accordance with an embodiment of this invention, parts being broken away to reveal interior construction, sectioning being omitted from ends of contact boards thereof for clarity.
Figure 8:
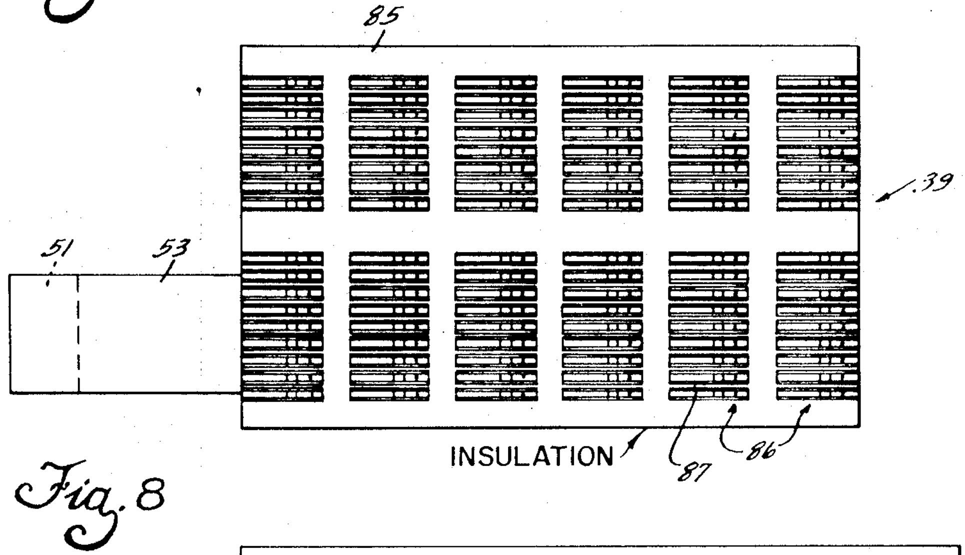
FIG. 8 is a bottom plan view of an upper movable contact board forming a part of the device.

In FIGS. 1, 2 and 3 is shown a device 20 constructed in accordance with an embodiment of this invention. The device includes rigid sidewall members 22 and 23 (FIGS. 1 and 3) which are integrally formed with a bottom panel 25 and are held in parallel spaced relation by end frames 24 and 26 which are attached to the sidewall members by screw fasteners 27 to form a substantially rectangular boxlike enclosure open at the top. The sidewall member 22 is provided with a plurality or parallel upright slots 28 which can receive edge portions of transverse circuit boards 29. The upright slots 28 terminate at a shoulder 31 which acts as a stop for the boards 29. The circuit boards 29 are held down against the shoulder 31 by a cover plate 32 which slides in lengthwise slots 32' in the sidewall members 22 and 23. In addition, the sidewall member 22 is provided with lengthwise parallel slots 33, 34, and 36 (FIGS. 1 and 13), which are parallel to the shoulder 31 and spaced therebelow. The slots 33, 34, and 36 receive edge portions of contact boards 37, 38, and 39, respectively. The sidewall member 23 (FIG. 1) is provided with similar upright slots 42 which terminate in a shoulder 43 and receive opposite edge portions of the transverse circuit boards and parallel lengthwise slots 44, 46, and 47 below the shoulder 43 which receive opposite edge portions of the contact boards 37, 38, and 39, respectively. The contact board 38 normally is stationary. The boards 37 and 39 can be advanced along the slots in which they are received by use of handles 49 and 51, respectively. The boards 37 and 39 are provided with extensions 52 (FIG. 7) and 53 (FIGS. 8 and 9), respectively which extend through openings 54 and 56 respectively in the end frame 24 and to which the handles 49 and 51, respectively, are attached.

Figure 6:
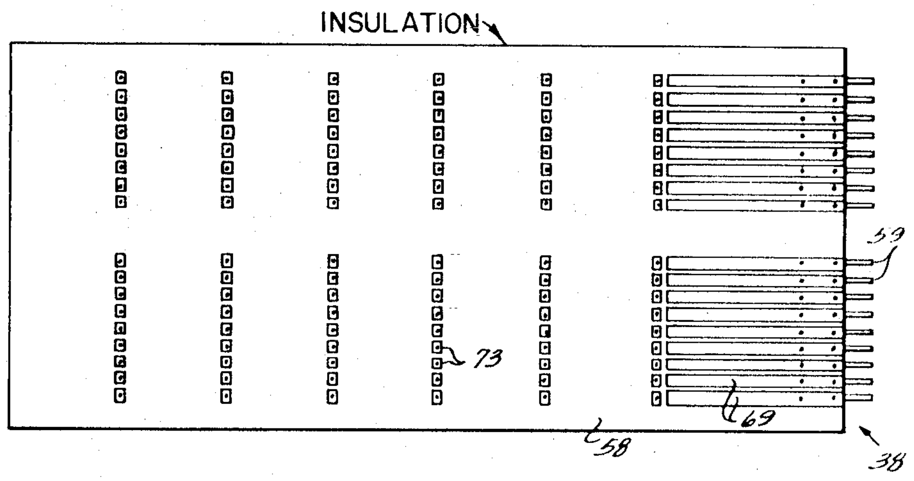
FIG. 6 is a bottom plan view of the stationary contact board shown in FIG. 5.
Figure 5:
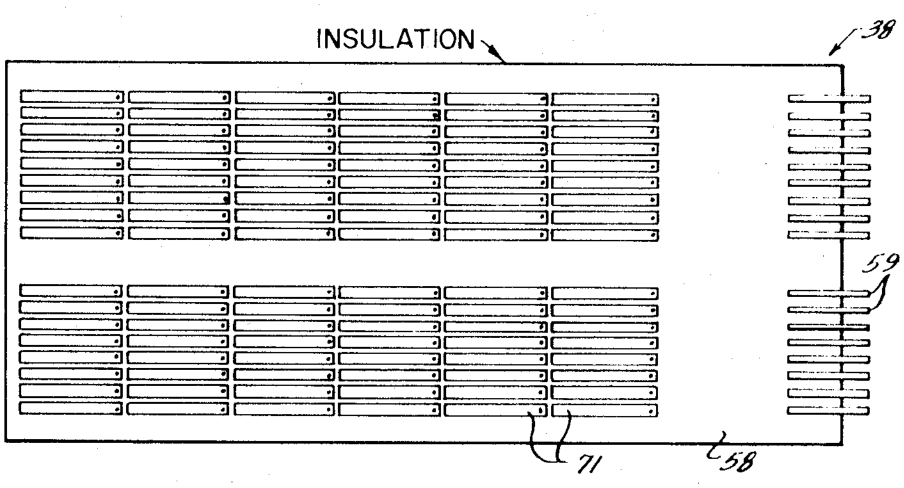
FIG. 5 is a top plan view of a stationary contact board forming a part of the device.
Figure 4:
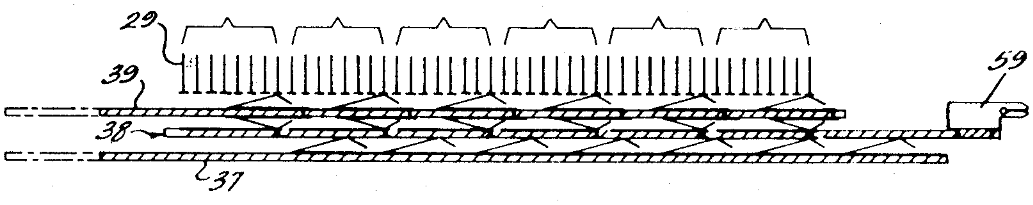
FIG. 4 is a diagrammatic view of circuit boards of the device, alternate positions of movable boards thereof being shown in dot-dash lines.

As shown in FIGS. 5 and 6, the stationary contact board 38 includes a body 58 which is of electrically nonconductive material. A plurality of plug members 59 are mounted at one end of the contact board 38 and extend outwardly of the device as shown in FIG. 3 through an opening 61 in the end frame 26. As shown in FIG. 2, the plugs are divided into an inlet bank M and an outlet bank N. The device can be mounted in an outer casing 62 having sockets 63 mounted therein, only one of which is shown, there being a socket for each plug. Outwardly extending ribs 64 and 66 (FIG. 1) on the sidewall members 22 and 23, respectively, are received in slots 67 (only one of which is shown) in walls of the outer casing to guide the plugs into the sockets 63. Each socket 63 carries a conductor 68 (FIG. 3) which is attached to one of the plugs 59 when the plug is received in its associated socket.

Figures 10, 13:
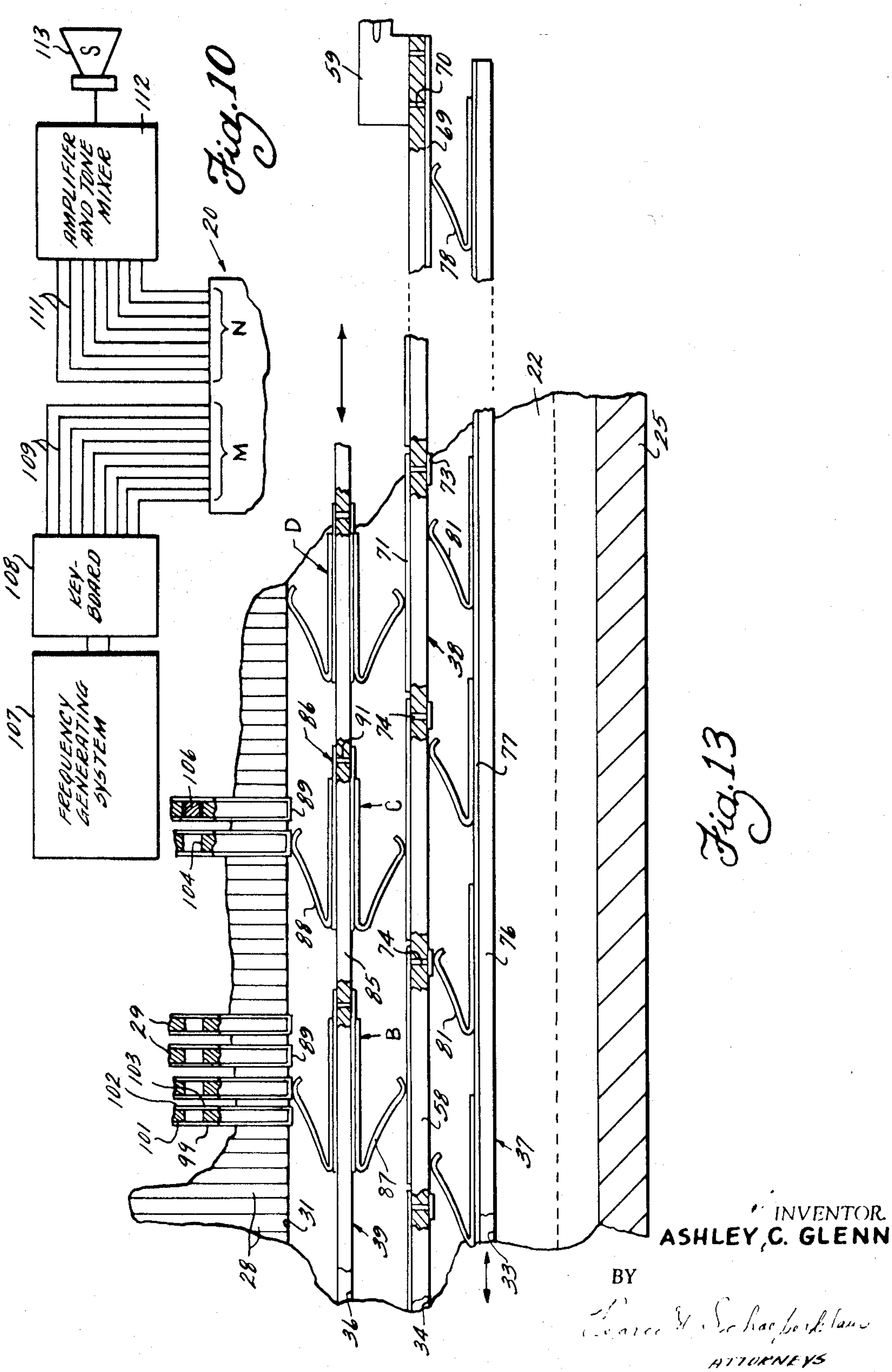
FIG. 10 is a schematic wiring diagram showing the device associated with related parts of an electronic organ.
FIG. 13 is a fragmentary view in section taken on the line 13—13 in FIG. 2 on an enlarged scale.

As shown in FIGS. 5, 6, and 13, each plug 59 is connected to an elongated electrical conductor strip 69 mounted on the underside of the contact board 38 by means of a conductor 70 (FIG. 13) which extends through the body 58. The conductor strips 69 extend parallel to each other. Aligned with each elongated contact strip 69 but on the upper side of the body 58 of contact board 38 are mounted a series of contact strips 71 (FIG. 5). Each contact strip 71 is connected to a small contact plate 73 (FIG. 13) mounted on the lower face of the contact board 38 in line with an associated elongated conductor strip 69 and connected to one of the contact strips 71 by a conductor 74 (FIG. 13) which extends through the body 58 of the contact board 38.

Figure 7:
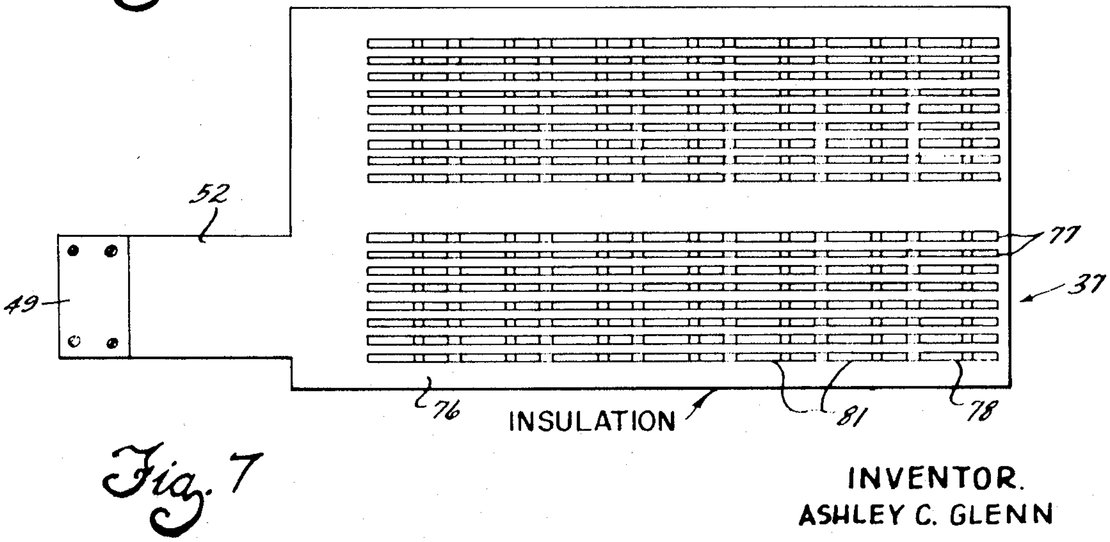
FIG. 7 is a top plan view of a lower movable contact board forming a part of the device.

The lower movable contact board 37, as shown in FIG. 7, includes a body 76 of electrically nonconductive material on an upper face of which are mounted a plurality of elongated conductor strips 77, there being one strip 77 for each plug 59 (FIG. 13). At the right hand end of each strip 77 is mounted an outlet spring contact 78 which engages one of the strips 69 on the stationary board 38, as shown in FIG. 13. The lower movable board 37 can move to the right or left as shown in FIG. 13, and the outlet contact 78 remains in engagement with the strip 69 throughout the movement thereof so that each elongated strip 77 is in electrical connection with one of the plugs 59 at all times and throughout the movement of the movable board 37. Each elongated conductor strip 77 also carries a plurality of spaced spring contacts 81, each of which is engageable with a selected one of the contact plates 73 of the stationary board 38. The spacing of each plate 73 from the adjoining plates 73 is sufficiently greater than the spacing between each spring contact 81 and the adjacent spring contacts 81 that only one of the plates 73 is engaged by one of the spring contacts 81 on a single elongated strip 77 at any one time. The spacing of plates and spring contacts is such that for each position of the movable board 37, plates 73 in a single transverse row are connected to the plugs 59 and only one row of plates 73 and contact strips 71 is connected to the plugs 59 at a single time and for a single position of the lower movable board 37.

Figure 9:
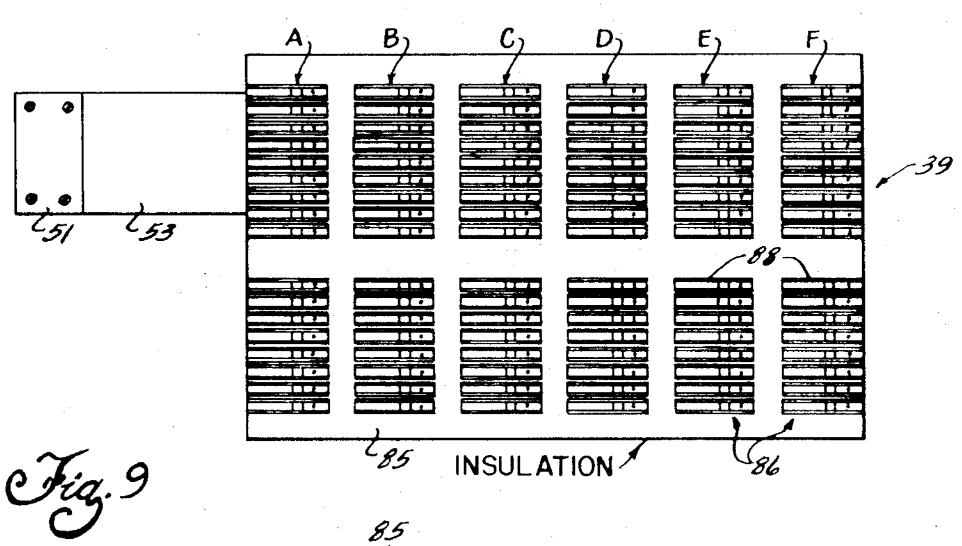
FIG. 9 is a top plan view of the contact board shown in FIG. 8.

The upper movable contact board 39 (FIGS. 8 and 9) includes a body 85 of electrically nonconductive material on which are mounted a plurality of pairs 86 (FIGS. 8, 9, and 13) of spring contacts. Each pair includes a lower contact 87 (FIG. 13) in sliding engagement with one of the contact strips 71, as shown in FIG. 13, of the stationary board 38 and an outwardly extending upper contact 88, which can engage a contact 89 of one of the plurality of interchangeable circuit boards 29. The contacts 87 and 88 of each pair are connected together by a conductor 91 extending through the body 85 of the board 39. As shown in FIG. 9, the upper contacts 88 are arranged in rows A, B, C, D, E, and F. For each position of the lower movable board 37, each upper contact 88 in one of the rows is connected to one of the plugs 59 (FIG. 13). For each position of the upper movable contact board 39, the upper contacts 88 in this row are aligned with one of the upright slots 28 and in position for engagement with one of the contacts 89 of an interchangeable circuit board received in that slot.

Figure 11:
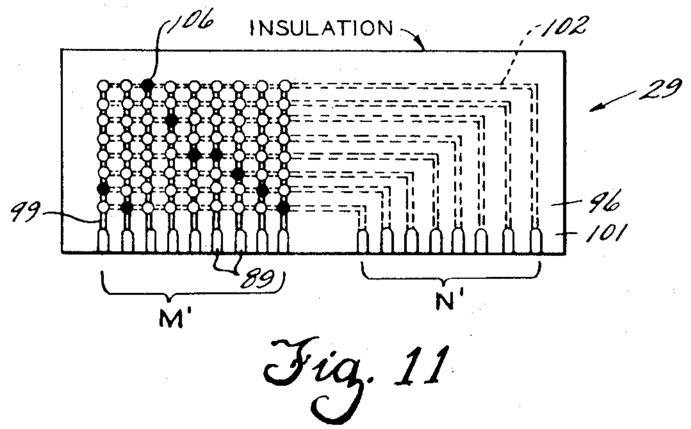
FIG. 11 is a view in front elevation of a transverse circuit board forming a part of the device.
Figure 12:
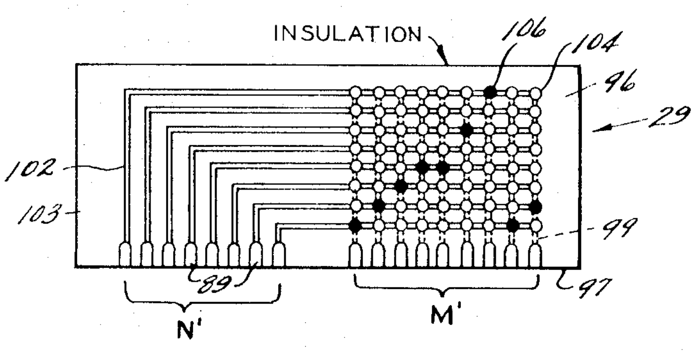
FIG. 12 is view in rear elevation of the transverse board shown in FIG. 11.
Figure 14:
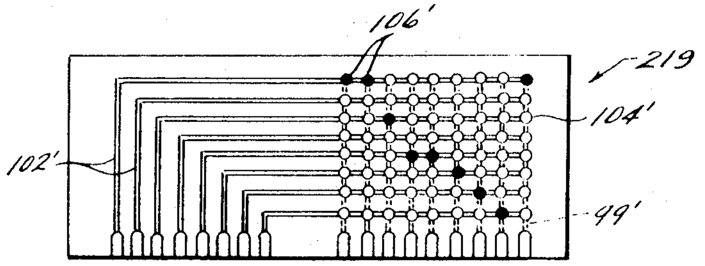
FIG. 14 is a view in rear elevation of another circuit board.

Details of construction of one of the interchangeable circuit boards 29 are shown in FIGS. 11 and 12. The board 29 includes a body 96 of nonconductive material. The contacts 89 are mounted on a lower edge portion 97 of the board 29. The contacts 89 are arranged in groups M′ and N′. From each contact 89 in the group M′, a conductor strip 99 extends upwardly on a front face 101 of the body 96 of the board 29. From each contact 89 in the group N′, a conductor strip 102 extends upwardly and transversely on a rear face 103 of the body 96 of the board 29, as shown in FIG. 12, the strips 102 extending transversely of the conductor strips 99 so that a portion of each conductor strip 102 is aligned with a portion of each conductor strip 99 on an opposite face of the board 29. Perforations 104 in the body of the board extend between aligned portions, and conductors 106 can be mounted in selected ones of the perforations 104 to connect selected conductors 102 with selected conductors 99. Variation of the location of the conductors 106 makes it possible to connect each conductor 99 with any one of the conductors 102. In FIG. 14 is shown another circuit board 219 provided with conductors 106′ in different perforations 104′ to provide another arrangement of connections between conductors 99′ and conductors 102′.

In FIG. 10 is shown a schematic circuit diagram for an electronic organ including my switching device. In the type of electronic organ shown, a frequency generating system 107 supplies signals to a keyboard 108. Operation of keys of the keyboard (not shown in detail) feeds selected signals to conductors 109. The conductors 109 are connected to the input bank M of plugs in the device 20. The outlet bank N of plugs is connected to output leads 111 which feed into an amplifying and mixing device 112 which delivers a final output signal to a speaker 113. The switching device 20 makes it possible to connect any one of the conductors 109 with any one of the conductors 111 to properly mix the signals of the conductors 109 and control the nature and quality of the sound emitted by the speaker 113.

In the use of the device, appropriate circuit boards are selected to provide the mixing required for a particular piece or pieces of music and are mounted in the slots 28 of the device 20 (FIG. 1). The circuit boards can be arranged in the order in which they will be required in the playing of the music. Then, as the music is played, the musician can advance or retract the handles 49 and 51 to properly select the mix of the signals.

The switching device replaces a large number of draw bars or the like which ordinarily are required to mix the signals and requires operation of only two handles instead of a large number of handles.

The switching device illustrated in the drawings and described above is subject to structural modification without departing from the spirit and scope of the invention.

Having described my invention, what I claim and desire to secure by Letters Patent is:

1. A switching device which includes a first contact board, a second contact board and a third contact board mounted parallel to each other, two of said contact boards being mounted for relative lengthwise movement, a plurality of elongated parallel conductor strips mounted on one face of said first contact board, a plurality of contact members mounted on each of said conductor strips, the contact members being arranged in rows extending transversely of the first contact board, a plurality of contact plates mounted on one face of the second contact board in position for engagement by contact members on the first contact board, the contact plates being arranged in rows extending transversely of the second contact board, the first contact board being movable lengthwise with respect to the second contact board to selected positions at each of which the contact plates of one row are in engagement with the contact members of one row of the first contact board, a plurality of contact strips mounted on the opposite face of the second contact board, each of the contact strips of the second contact board being connected to one of the contact plates, the contact strips on the second contact board being arranged in rows extending transversely of the second contact board, a plurality of interconnected pairs of contact members on the third contact board, the contacts of each pair being on opposite sides of the third contact board, one contact of each pair being in engagement with one of the contact strips of the second contact board, the other contact of each pair extending outwardly thereof, the outwardly extending contacts being arranged in rows extending transversely of the third contact board, a plurality of circuit boards, each of the circuit boards having contacts engageable with outwardly extending contacts of a selected row and means for interconnecting selected contacts of the circuit board, and means for removably mounting the circuit boards in position for engagement with the outwardly extending contacts of one row, the third contact board being movable with respect to the circuit board holding means to position the outstanding contacts of a selected row in engagement with contacts of a selected circuit board, whereby selected elongated conductor strips of the first contact board are interconnected when the movable contact boards are in selected positions.

2. A switching device as in claim 1 wherein the second contact board is stationary, a plurality of connector plugs is mounted on the second contact board, a plurality of conductor strips is mounted on the second contact board, each of the conductor strips on the second contact board being connected to one of the plugs, and an outlet contact is mounted on each of the elongated conductor strips on the first contact board, each of the outlet contacts engaging one of the conductor strips on the second contact board, whereby each of the elongated conductor strips on the first contact board is connected to one of the plugs.

3. A switching device as in claim 1 wherein the boards are mounted inside a hollow enclosure having spaced parallel board supporting and guiding walls, there being three elongated parallel inwardly opening opposed slots in each wall, the parallel slots receiving opposed edge portions of the contact boards with the first and third contact boards being slideable along the slots receiving same, there being slots extending transversely of the elongated slots and receiving opposed edges of the circuit boards.

4. A switching device as in claim 3 wherein there are handles mounted on the first and third contact boards and extending outwardly of the enclosure for sliding the first and third contact boards between the selected positions.

* * * * *